US007224183B2

(12) United States Patent
Baeckler et al.

(10) Patent No.: US 7,224,183 B2
(45) Date of Patent: May 29, 2007

(54) FAST METHOD FOR FUNCTIONAL MAPPING TO INCOMPLETE LUT PAIRS

(75) Inventors: Gregg William Baeckler, San Jose, CA (US); Babette van Antwerpen, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 105 days.

(21) Appl. No.: 11/201,565

(22) Filed: Aug. 10, 2005

(65) Prior Publication Data

US 2007/0035327 A1 Feb. 15, 2007

(51) Int. Cl.
*H03K 19/173* (2006.01)
(52) U.S. Cl. .......................................... 326/38; 326/41
(58) Field of Classification Search ............ 326/37–41; 716/12, 16, 17
See application file for complete search history.

(56) References Cited

U.S. PATENT DOCUMENTS 5,990,702 A * 11/1999 Agrawal et al. ............... 326/41

2005/0040849 A1* 2/2005 Pugh et al. ................... 326/39
2006/0161725 A1* 7/2006 Lee et al. .................... 711/103

* cited by examiner

*Primary Examiner*—Don Le
(74) *Attorney, Agent, or Firm*—Townsend and Townsend and Crew LLP

(57) ABSTRACT

A configuration for a programmable device is determined to implement an incomplete function using at least two logic cells. Function inputs are partitioned into portions associated with first and second logic cells. The partitioning is screened to determine if it is potentially acceptable by determining if a portion of the function can be implemented using a complete look-up table. If the partitioning of the function inputs is potentially acceptable, the function inputs are assigned to the input ports of the logic cells. Variables are assigned to look-up table locations and a correspondence is determined between function input and output values, the variables, and the look-up table locations. Boolean tautology rules are applied to the correspondence to simplify the variables. If the simplified variables are consistent, a configuration is output that includes assignments of function inputs to input ports and look-up table data based on the simplified variables.

28 Claims, 16 Drawing Sheets

| WXYZ | QR = 00 | QR = 01 | QR = 10 | QR = 11 |
|------|---------|---------|---------|---------|
| 0000 | 1 | 457<br>0 | 1 | K |
| 0001 | 0 | 459<br>0 | 0 | !K |
| 0010 | 1 | 469<br>G | 1 | 0 |
| 0011 | 1 | 461<br>1 | 0 | 0 |
| 0100 | F | 463<br>1 | 0 | 0 |
| ... | ... | ... | ... | ... |
| 1110 | !F | 465<br>G | H | 1 |
| 1111 | 0 | 467<br>!G | H | 1 |

| WXYZ | QR = 00 | QR = 01 | QR = 10 | QR = 11 |
|------|---------|---------|---------|---------|
| 0000 | 1 | 0 | 1 | K |
| 0001 | 0 | 0 | 0 | !K |
| 0010 | 1 | G | 1 | 0 |
| 0011 | 1 | 1 | 0 | G |
| 0100 | F | 1 | 0 | !G |
| ... | | | | |
| 1110 | G | G | H | !F |
| 1111 | 0 | !G | !F | 1 |

FIG. 4D

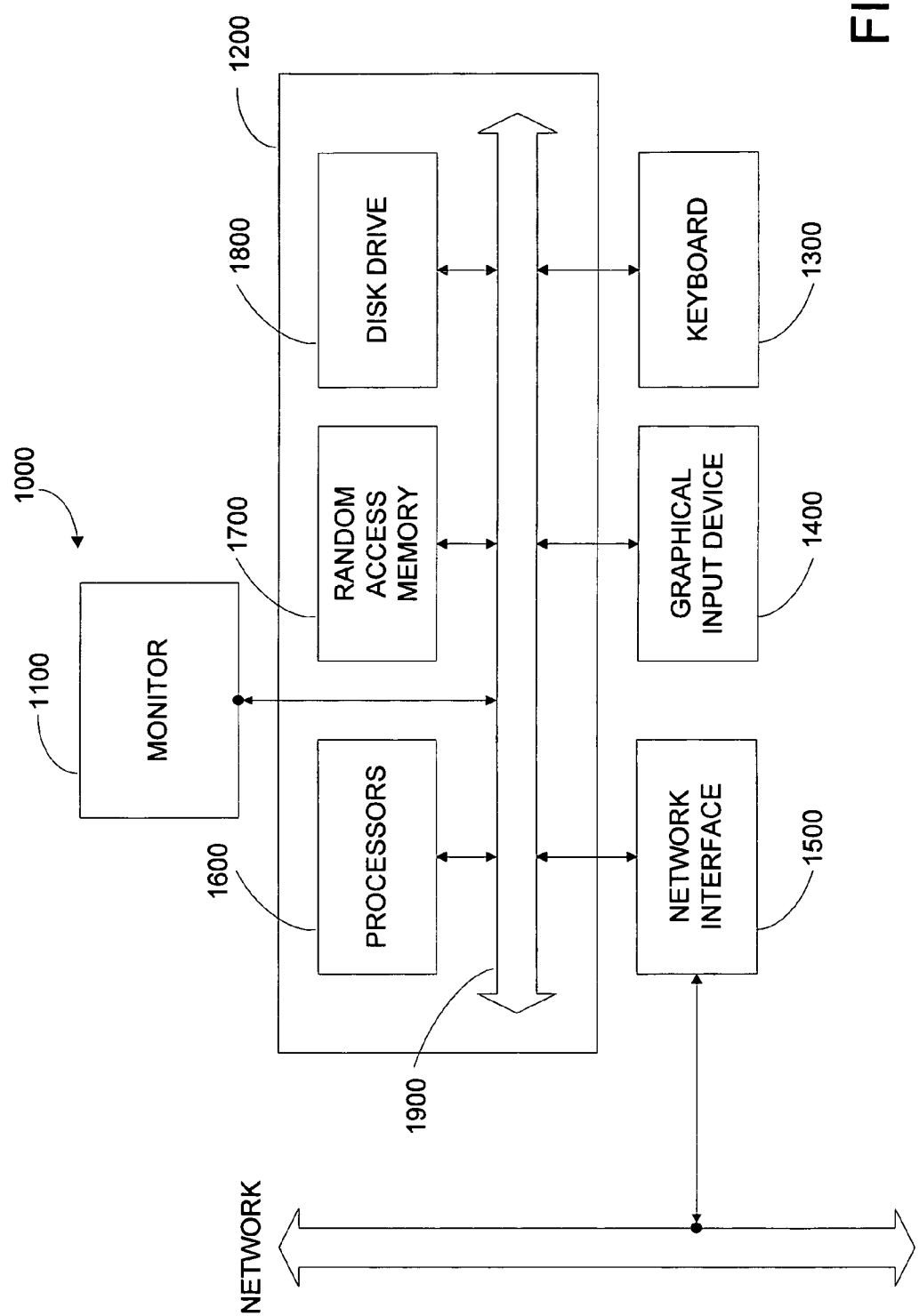

FAST METHOD FOR FUNCTIONAL MAPPING TO INCOMPLETE LUT PAIRS

BACKGROUND

The present invention relates to the field of programmable devices, and the systems and methods for programming the same. Programmable devices, such as FPGAs, typically includes thousands of programmable logic cells that use combinations of logic gates and/or look-up tables to perform a logic operation. Programmable devices also include a number of functional blocks having specialized logic devices adapted to specific logic operations, such as adders, multiply and accumulate circuits, phase-locked loops, and memory. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

A typical compilation process for determining the configuration of a programmable device, referred to compilation, starts with an extraction phase, followed by a logic synthesis phase, a fitting phase, and an assembly phase. The extraction phase takes a user design, typically expressed as a netlist in a hardware description language such as Verilog or VHDL, and produces a set of logic gates implementing the user design. In the logic synthesis phase, the set of logic gates is permuted over the hardware architecture of the programmable device in order to match elements of the user design with corresponding portions of the programmable device. The fitting phase assigns the various portions of the user design to specific logic cells and functional blocks (sometimes referred to as placement) and determines the configuration of the configurable switching circuit used to route signals between these logic cells and functional blocks (sometimes referred to as routing), taking care to satisfy the user timing constraints as much as possible. In the assembly phase, a configuration file defining the programmable device configuration implementing the user design is created. The programmable device configuration can then be loaded into a programmable device to implement the user design. Programmable devices can be configured with the configuration during or after manufacturing.

One of the substantial challenges of the logic synthesis phase is efficiently implementing portions of the user design with programmable device resources. Often, the logic synthesis phase strives to implement portions of the user design with as few logic cells as possible. The hardware description of user designs often includes a number of registers or flip-flops connected by numerous logic gates. Functional logic synthesis techniques evaluate the logic gates specified by the user design and determine corresponding abstract Boolean functions. These Boolean functions can then be mathematically manipulated into forms suitable for efficient implementation by the logic cells of the programmable device.

Boolean functions can be classified as completely specified or incompletely specified. A completely specified function is fully defined for all input values. A completely specified function with N inputs typically requires of look-up table (LUT) of $2^N$ bits to implement. An incompletely specified function is undefined for some input values. The input values corresponding with undefined function values are referred to as don't-care inputs. It is often possible to implement incompletely specified functions with N inputs with a LUT having less than $2^N$ bits. A LUT or logic cell having N inputs but less than $2^N$ bits is referred to as an incomplete LUT. A function that can be implemented using an incomplete LUT is referred to as an incomplete function.

Many user designs specify incomplete functions. For relatively simple functions, these incomplete functions can often be implemented in a single logic cell. For example, if a logic cell includes a pair of five input LUTs connected with a multiplexer controlled by another input, the logic cell only includes enough memory to implement a complete six input function. However, it is often possible to implement a seven input incomplete function with the same logic cell.

For a function having a large number of inputs, it is often necessary to implement the function using a two or more logic cells. To implement functions using multiple logic cells, it is necessary to determine an assignment of function inputs to each logic cell; for each logic cell, an assignment of function inputs and other logic cell outputs to specific logic cell input ports; and to determine the data values to be stored in the one or more LUTs in each logic cell. It is relatively easy to implement complete functions using multiple logic cells. Implementing incomplete functions as complete functions in multiple logic cells is also relatively easy; however, this often uses more programmable device resources than necessary.

There are several prior functional logic synthesis techniques adapted to implement incomplete functions using a minimal amount of programmable device resources. However, these prior techniques perform poorly with incomplete functions having a large number of inputs or being implemented by two or more logic cells. For example, binary decision diagrams (BDD) solver builds a decision tree data structure that enumerate the function outputs for all combinations of input values for different potential sets of logic cell input port assignments. The BDD solver then extracts patterns from this decision tree data structure to determine if a given set of potential logic cell input port assignments can implement the function correctly. Typically, the BDD solver must evaluate decision tree structures for a large number of different potential logic cell input port assignments before finding an acceptable logic cell input port assignment. Additionally, the size of each decision tree structure increases exponentially with the number of inputs. As a result, the BDD solver is very slow and consumes a large amount of memory. Similarly, SAT solvers adapted to find acceptable logic cell input port assignments for incomplete functions are very slow because they must evaluate a large number of potential logic cell input port assignments to find a valid solution.

It is therefore desirable to have a fast and efficient system and method to determine an implementation of incomplete functions using multiple logic cells. It is further desirable for the system and method to quickly screen out potential function implementations that are not likely to provide acceptable results. It is desirable for the system and method to determine look-up table data for one or more look-up tables from a given set of input assignments and to produce logic cells having desired qualities.

BRIEF SUMMARY

An embodiment of the invention determines a configuration for a programmable device that implements an incomplete function using at least two logic cells. An arrangement of a first and second logic cells is specified. The arrangement includes an output of the second logic cell connected with one of a first set of logic cell input ports of the first logic cell. The embodiment receives a function including function inputs, creates a partitioning of the function inputs into a first portion associated with a first logic cell and a second portion associated with a second logic cell, and screens the partitioning of the function inputs to determine if the partitioning is potentially acceptable.

If the partitioning of the function inputs is potentially acceptable, an embodiment creates an assignment of at least the first portion of function inputs to the first set of logic cell input ports and an assignment of the second portion of function inputs to a second set of logic cell input ports of the second logic cell. The embodiment also assigns variables to look-up table locations of the first and second logic cells and determines a correspondence between function input values, function output values, the variables, and the look-up table locations based on the arrangement of the first and second logic cells and the assignments of the portions of the function inputs to the first and second sets of logic cell input ports. Boolean tautology rules are applied to the correspondence to create a simplified set of variables. The simplified variables are evaluated for consistency and a configuration is output that includes assignments of the portions of the function inputs to the first and second sets of logic cell input ports and the simplified set of variables.

In an embodiment, the Boolean tautology rules are based on the relationship between the first set of logic cell input ports, a selection of at least one look-up table location in the first logic cell, and an output of the first logic cell. In a further embodiment, applying the Boolean tautology rules to the correspondence to create a simplified set of variables includes assigning an arbitrary value to at least one of the variables. In yet another embodiment, the arbitrary value is specified in accordance with a desired logic cell attribute.

An embodiment screens the partitioning of the function inputs by determining if the first portion of the function inputs can be implemented using a complete look-up table. A further embodiment enumerates the function input values for a subset of the first portion of the function inputs associated only with the first logic cell, generates cofactors representing function output values corresponding with the function input values, enumerates second function input values for a subset of the first portion of the function inputs associated with the first and second logic cells, and extracts the second function input values from the cofactors, thereby forming a subset of cofactors for each of the second function input values. This embodiment then evaluates each of the subsets of cofactors for consistency and specifies that the partitioning of the function inputs is potentially acceptable if each of the subsets of cofactors is consistent.

BRIEF DESCRIPTION OF THE DRAWINGS

The invention will be described with reference to the drawings, in which:

FIGS. 4A–4D illustrate an example application of a method of screening a potential function implementation according to an embodiment of the invention;

FIG. 10 illustrates a computer system suitable for implementing an embodiment of the invention.

DETAILED DESCRIPTION

Figure 1A:
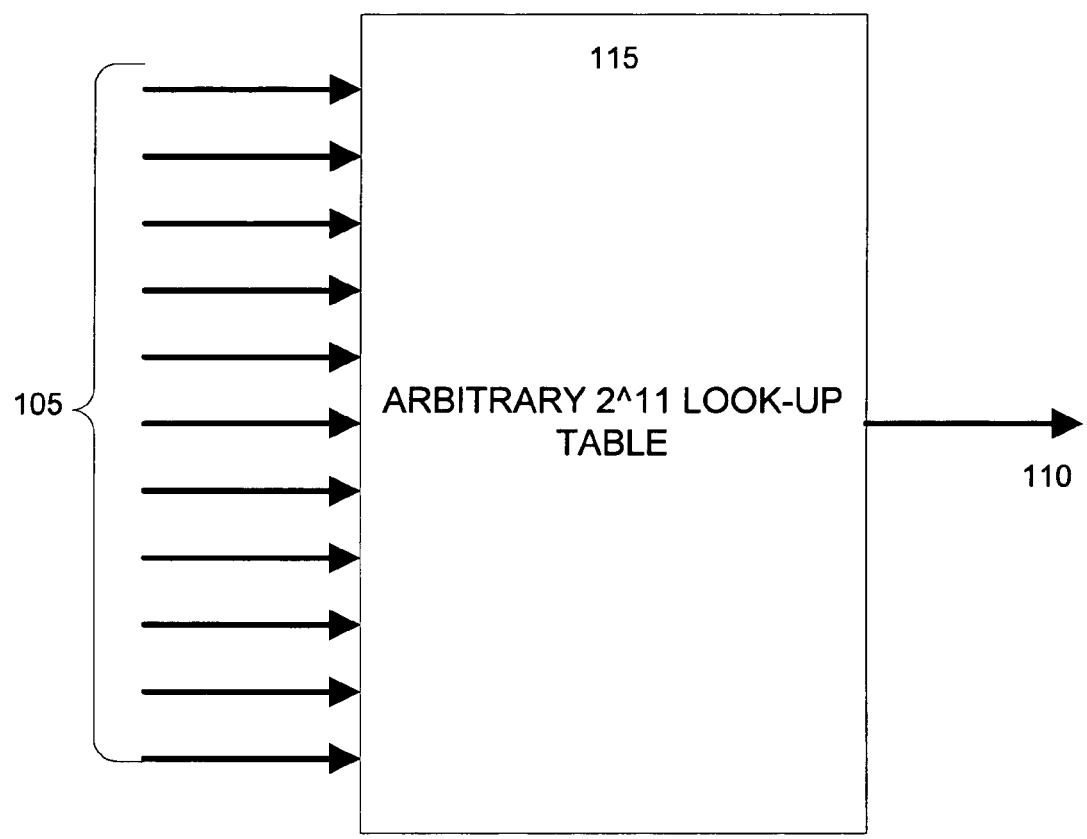
FIGS. 1A–1C illustrate an example function from a user design and example programmable device hardware suitable for implementing this function.

An embodiment of the invention can quickly and efficiently determine an implementation of an incomplete function requiring two or more logic cells, if such a solution exists. FIG. 1A illustrates an example function 100. The example function 100 includes eleven binary-valued inputs and a single binary-valued output 110. Generally, any arbitrary eleven input binary function (i.e., both complete and incomplete functions) can be implemented using a look-up table 115 having $2^{11}$ bits. In this implementation, the values of the set of inputs 105 are used as an index to retrieve an entry in the table, the value of which corresponds to the output of the function for the given input values.

Figure 1B:
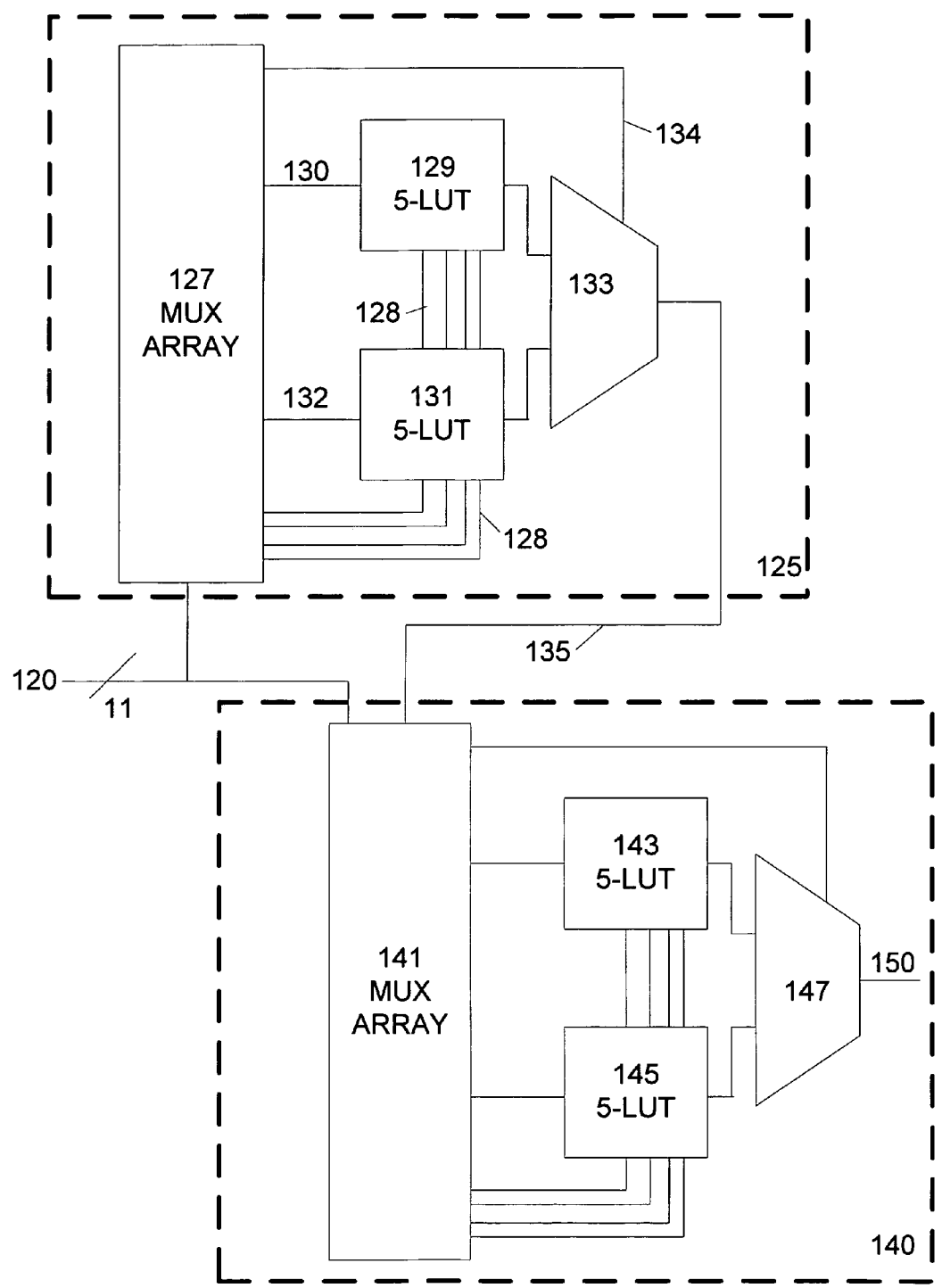

If the function 100 is an incomplete function, it may be possible to implement function 100 using substantially less resources. FIG. 1B illustrates a pair of example logic cells of a programmable device suitable for implementing many eleven input incomplete functions. In this example, the set of eleven function inputs 120 are connected with logic cells 125 and 140. Logic cells 125 and 140 can be referred to as tail and head logic cells, respectively. In logic cell 125, a multiplexer array 127 receives a subset of up to seven of the eleven function inputs 120. In an embodiment, six of the inputs of the subset of function inputs are connected as follows. The multiplexer array 127 connects four inputs 128 of the selected input subset with both look-up tables 129 and 131. Additionally, input 130 of the subset is connected with look-up table 129 and input 132 of the subset is connected with look-up table 131. Look-up tables 129 and 131 are both five input look-up tables capable of storing up $2^5$ or 32 bits of data. The outputs of look-up tables 129 and 131 are connected with multiplexer 133, which connects one of the look-up table outputs with the logic cell output 135. A seventh input of the subset controls multiplexer 133 and the selection of a look-up table output.

The output of logic cell 125, along with function inputs 120, are connected with logic cell 140. Logic cell 140 includes a multiplexer array 141, two five input look-up tables 143 and 145, and output multiplexer 147. In an embodiment, another subset of the function inputs 120 are connected with the components of logic cell 140 in a similar manner as in logic cell 125. In this configuration, the output 150 of logic cell 140 typically represents the output of the function specified by the user design. When implementing a function using two or more logic cells, the subset of inputs typically connected with the multiplexer array of logic cell 140 includes the output of logic cell 125. Additionally, the subset of inputs used be logic cell 140 may include one or more inputs also used by logic cell 125. These common inputs are referred to as shared or bridged inputs.

Figure 1C:
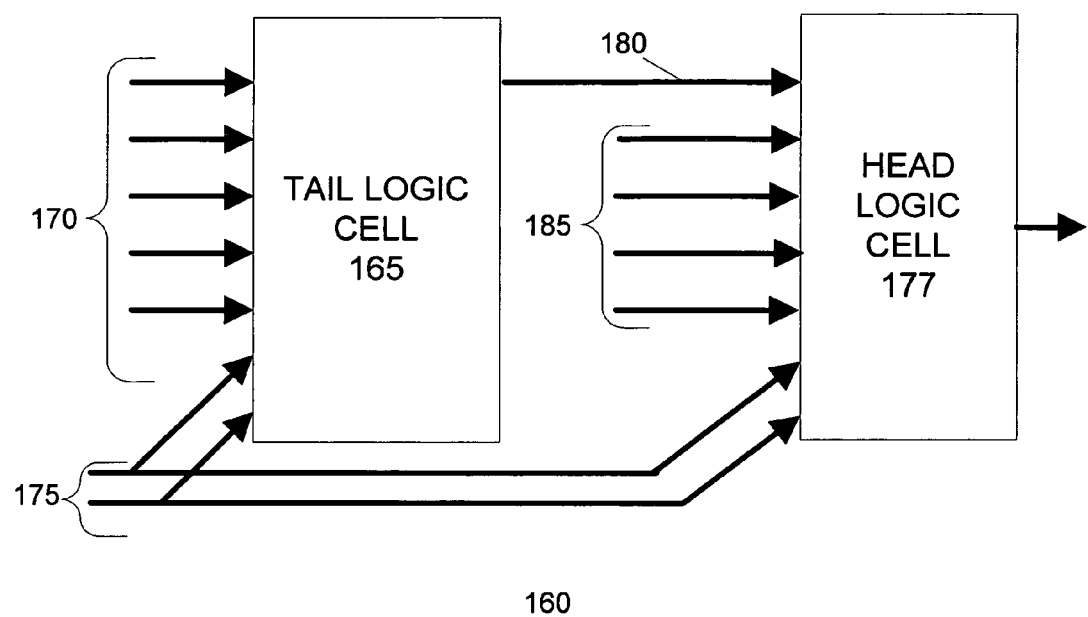

FIG. 1C illustrates an example assignment 160 of function inputs to a pair of logic cells, such as those described in FIG. 1B. This configuration provides substantial savings in programmable device resources over the complete function implementation in FIG. 1A. For example, the two logic cells have a combined total of 128 bits of look-up table memory, as compared with the $2^{11}$ or 2048 bits needed to implement a complete eleven input function.

In the example of FIG. 1C, the tail logic cell 165 is connected with five unique function inputs 170 and two bridged function inputs 170. Head logic cell 177 is connected with the output 180 of the tail logic cell, four unique function inputs 185, and the two bridged function inputs 175. In this configuration, example assignment 160 is capable of implementing an eleven input incomplete function, provided that a satisfactory logic cell input port assignment and look-up table data can be determined for the function.

Figure 2:
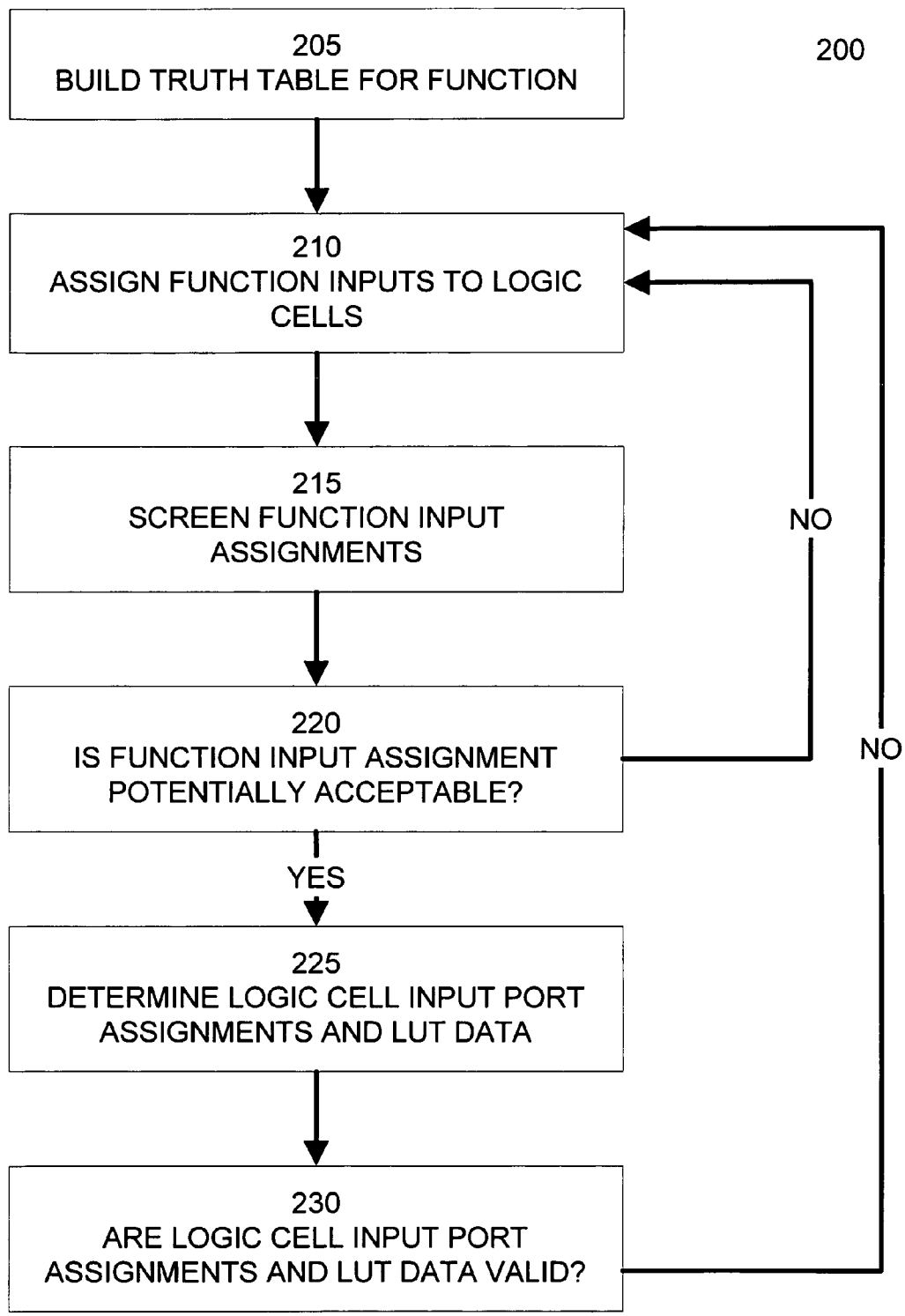
FIG. 2 illustrates a method of determining an implementation of an incomplete function according to an embodiment of the invention.

To this end, FIG. 2 illustrates a method 200 of determining an implementation of an incomplete function according to an embodiment of the invention. Step 205 receives a function that is to be implemented with two logic cells, connected as described above. In an embodiment, the function is received from a phase of compilation process that extracted the function from the hardware description of a user design.

Step 205 analyzes the function and creates a truth table or other data structure enumerating the input and corresponding output values of the function. In an embodiment, the truth table can be created by iterating through all possible combinations of input values and recording the corresponding values of the function.

Step 210 assigns function inputs to the logic cells. In an embodiment, step 210 partitions the set of inputs into three subsets representing inputs associated with the head logic cell only, the tail logic cell only, and the bridged inputs connected with both logic cells. In a further embodiment, step 210 assigns a subset of function inputs to the head logic cell and the bridged inputs, leaving the function input assignment to the tail logic cell implicit. The function input assignments of step 210 represent the association of a subset of function inputs with one or more logic cells. However, an embodiment of step 210 does not assign function inputs to specific input ports of the logic cells. Instead, input port assignments are determined in step 225, discussed below.

Step 210 may be repeated many times during the execution of method 200, so an embodiment of step 210 is structured so as to not select any previously analyzed function input assignments. This can be done by assigning sets of function inputs in a specific order or by maintaining a list or other indicator of the previously analyzed function input assignments.

Step 215 screens the function input assignments selected in step 210 for acceptability. An embodiment of this screening is described by method 300, discussed below. Step 220 evaluates the result of this screening. If step 215 determines the function input assignments are unacceptable, then the incomplete function cannot be implemented with two logic cells using the selected function input assignment. As a result, method 200 returns to step 210 following step 220 to select a different function input assignment. If step 215 determines that the function input assignment is acceptable, then it may be possible to implement the incomplete function using the function input assignment. Thus, method 200 proceeds to step 225 to further analyze the selected function input assignment.

Step 225 also attempts to determine specific logic cell input port assignments for the function inputs associated for each logic cell. In an embodiment, function inputs cannot be assigned to arbitrary input ports of a logic cell because the logic cell has different components associated with its inputs. For example, in each of the logic cells shown in FIG. 1B, four input ports are connected to both five input look-up tables, two input ports are connected to only one look-up table each, and one input port is controls an output multiplexer. Thus, function inputs must be assigned to input ports associated with components that are consistent with the function inputs' roles in the function. Additionally, step 225 attempts to determine look-up table data for each of the look-up tables in the logic cells. The look-up table data defines function output values for every combination of function input values with respect to a specific set of logic cell input port assignments. An embodiment of a method of determining logic cell input port assignments and look-up table data is described by method 500, discussed below.

Step 230 tests the logic cell input port assignments and look-up table data determined by step 225 for validity. In an embodiment, step 230 receives a signal from step 225 indicating whether a valid logic cell input port assignment and look-up table data has been determined. If step 230 determines that the results from a previous iteration of step 225 are valid, method 200 terminates and the logic cell input port assignments and look-up table data is output as an implementation of the function using two logic cells.

If step 230 determines that all of the possible permutations of logic cell input port assignments for a given assignment of function inputs to logic cells have been evaluated and that there are no valid logic cell input port assignments for a given assignment of function inputs to logic cells, method 200 returns to step 210 to select another assignment of function inputs to logic cells. If step 210 determines that all of the possible function input assignments to logic cells have already been analyzed, method 200 terminates and outputs a message indicating that it was unsuccessful in implementing the function using two logic cells. In response, compilation software can attempt to use other techniques to implement the function, such as treating the function as a complete function.

Figure 3:
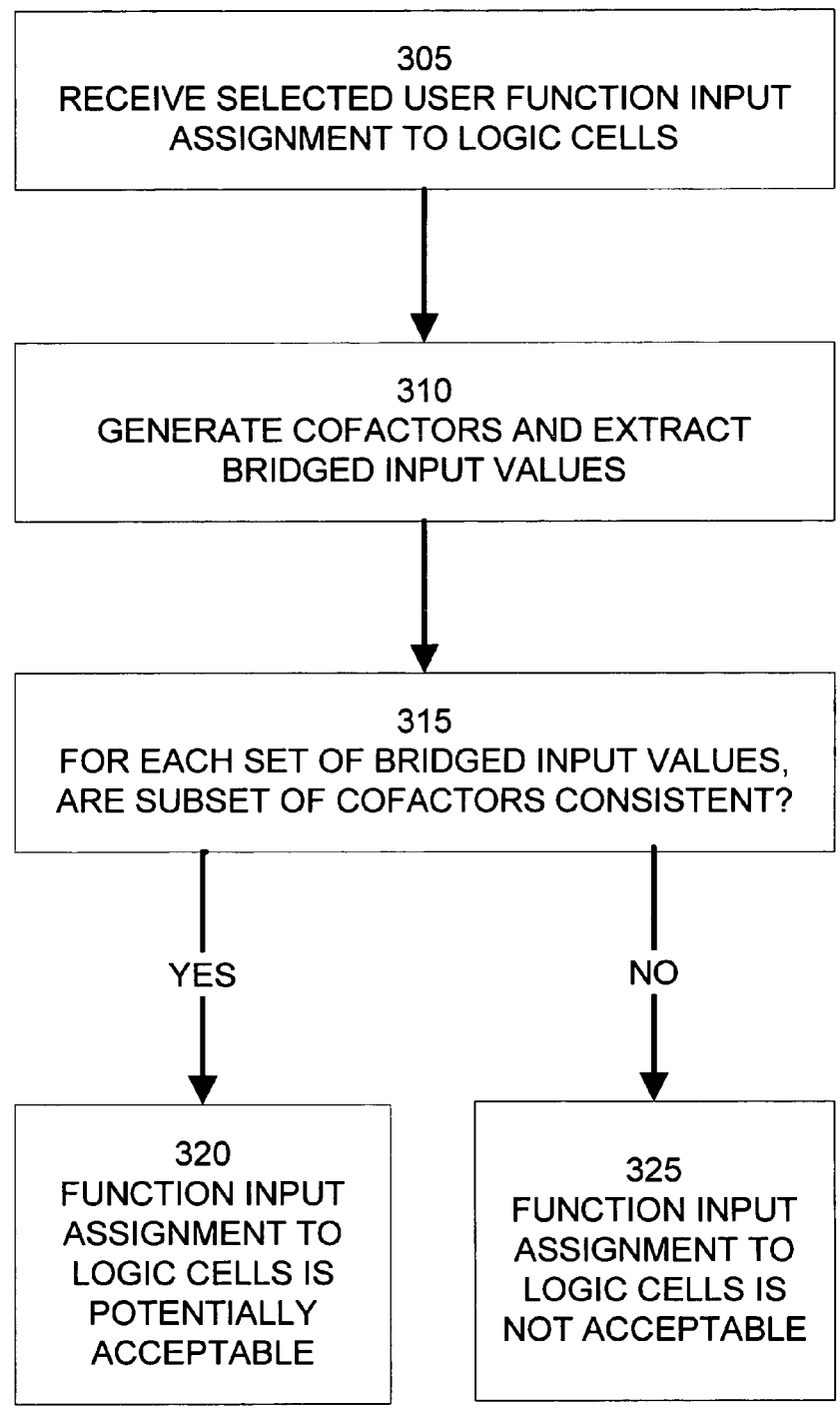
FIG. 3 illustrates a method of screening potential function implementations according to an embodiment of the invention.

FIG. 3 illustrates a method 300 of screening potential function implementations according to an embodiment of the invention. In an embodiment, method 300 can be utilized by step 215 of method 200 discussed above. Method 300 determines if a potential function can be implemented using logic cells implementing complete look-up tables. Although the logic cells shown in FIG. 1B have incomplete look-up tables, method 300 is useful for screening out invalid potential function implementations. If a potential function implementation cannot be implemented using logic cells with complete look-up tables, it follows that the potential function implementation also cannot be implemented using logic cells with incomplete look-up tables.

Step 305 receives the function input assignments to logic cells as selected in step 210. In an embodiment, step 305 receives the function inputs assigned to the head logic cell only as well as the function inputs assigned as bridged inputs to both logic cells. For the purposes of discussion, the function inputs assigned to the head logic cell only are designated as (WXYZ) and the function inputs assigned as bridged inputs to both logic cells are designated (QR).

Figure 4A:
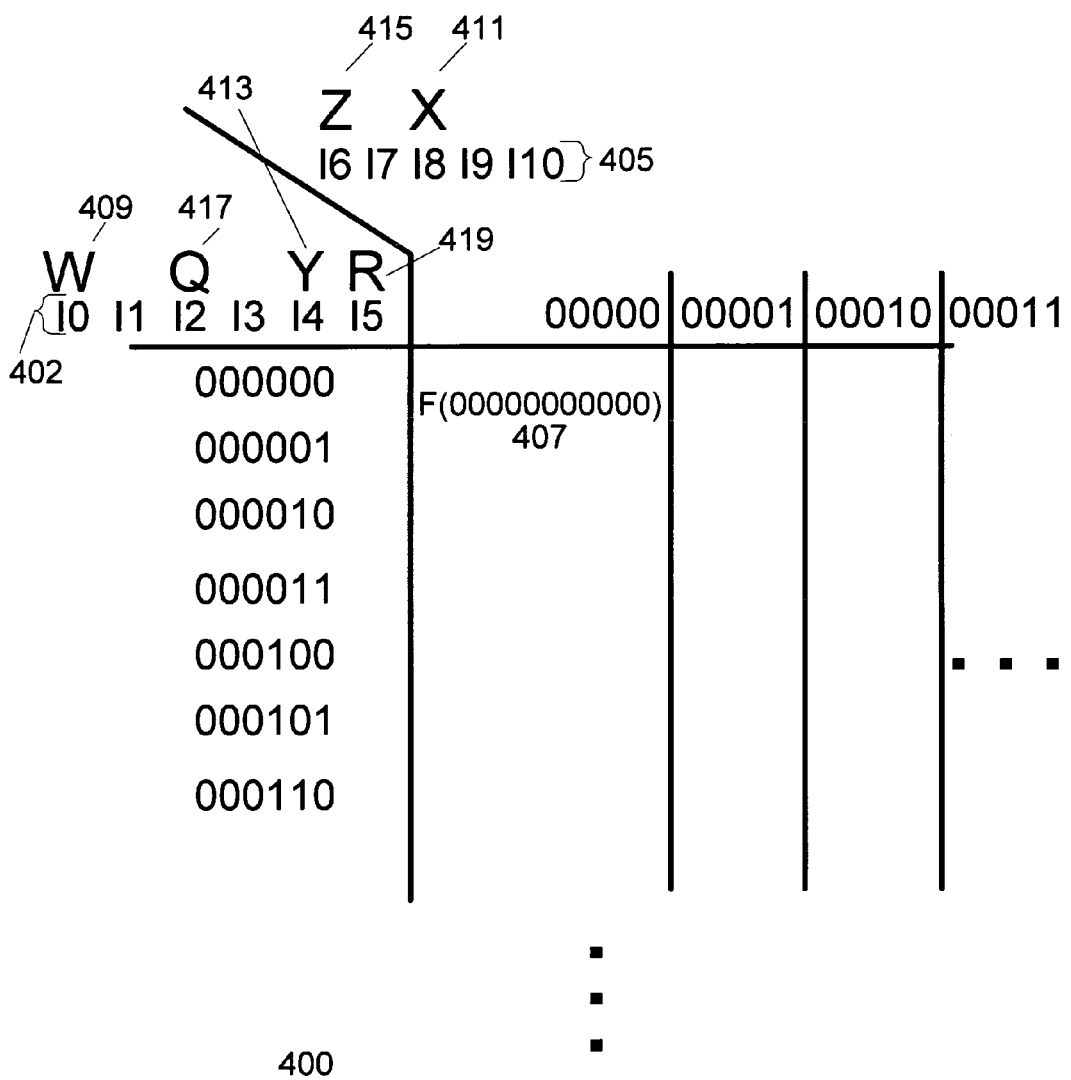

FIG. 4A illustrates an example application of step 305 according to an embodiment of the invention. FIG. 4A illustrates a truth table 400 representing an eleven input user function. The eleven inputs are designated I0 through I10. All of the possible values of the function inputs I0 through I5, 402, are enumerated in the rows of the table 400. Similarly, all of the possible values of the function inputs I6 through I10, 405, are enumerated in the columns of table 400. At each intersection of a row and column, the value of the user function for the associated input values is specified. For example, at the intersection 407 of the first row and column, the value of the user function for the set of input values (00000000000) is specified.

Step 305 receives the function input assignments for the head logic cell (WXYZ) and the bridged inputs (QR). In the example of FIG. 4A, W is assigned to function input I0, 409; X is assigned to function input I8, 411; Y is assigned to function variable I4, 413; and Z is assigned to function variable I6, 415. Similarly, function variable I2 is assigned to bridged input Q, 417; and function variable I5 is assigned to bridged input R, 419.

Following step 305, step 310 generates the cofactors of the user function truth table for the selected set of head logic cell inputs (WXYZ) and extracts the values of the selected bridged inputs (QR). Step 310 can be performed by reordering the data of the truth table representing the user function according to the inputs selected as WXYZ and QR.

Figure 4B:
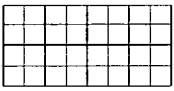

FIG. 4B illustrates an example application of step 310 according to an embodiment of the invention. FIG. 4B illustrates an example user function truth table 425 arranged according to inputs selected as WXYZ and QR. All of the possible values of head logic cell inputs (WXYZ), 427, are enumerated with the rows of the table 425. In this example, there are sixteen rows, corresponding to the sixteen possible values of the inputs WXYZ, in table 425. In FIG. 4B, some of these rows are omitted for clarity. Similarly, all of the possible values of inputs QR, 429, are enumerated with the columns of table 425. In this example, there are four columns, corresponding to the four possible values of inputs QR, in table 425.

In table 425, each row corresponds to a cofactor of the user function. For example, row 431 is the cofactor of inputs (WXYZ)=(0100). In this example, the row 431 includes the set of 128 or $2^7$ values of the user function given (WXYZ)=(0100). Similarly, the intersection of a row and column defines a subset of a cofactor. For example, the intersection of row 431 with column 433, which represents the values of the user function given (QR)=(00), is cofactor subset 435. Cofactor subset 435 represents the all of the values of the user function given (WXYZ)=(0100) and (QR)=(00). In this example, cofactor subset 435 represents 32 or $2^5$ user function values.

Step 315 analyzes the subsets of cofactors associated with each set of bridged input values to determine if they are internally consistent. The subsets of cofactors associated with a set of bridged input values are internally consistent if the user function values for each subset are either all 1 or all 0. Additionally, the subsets of cofactors associated with a set of bridged input values are internally consistent if the user function values for each subset are equal to a single arbitrary function of the unused function inputs, which are associated with the tail logic cell, or its inverse.

FIG. 4C illustrates an example application of step 315 according to an embodiment of the invention. FIG. 4C illustrates an example table 450 arranged according to cofactors and extracted bridged input values, similar to the table 425 of FIG. 4B. As discussed above, each row of the table 450 represents a cofactor of the user function. In table 450, some rows are omitted for clarity. In this example, the intersection of a row and column of the table 450 represents the set of 32 user function values given the corresponding values of inputs WXYZ and QR.

Step 315 evaluates each set of user function values associated with a set of bridged input values. In the case of table 450, step 315 evaluates the subsets of user function values associated with each column. For each column, step 315 determines if each subset of user function values is equal to all 1 or all 0. If so, then the subset is consistent. Subsets in a column that are not all 1 or all 0 may still be consistent if they can be represented as a single arbitrary function of the unused function inputs or its inverse.

For example, column 455 includes subsets such as 457 and 459 with user function values of all 0. Column 455 also includes subsets such as 461 and 463 with user function values of all 1. Subsets 465 and 469 have user function values that are defined by function G, which is an arbitrary function of the five function inputs not assigned to (WXYZ) or (QR). Subset 467 has user function values defined by the inverse of function G. As all of the cofactor subsets in column 455 have function values of either all 1, all 0, all a function of G, or all a function of the inverse of G, this column is consistent.

Step 315 repeats this evaluation for the other columns of the table 450. It should be noted that the arbitrary function of the unused inputs can vary from column to column without affecting the overall consistency. For example, column 470 include subsets 472 and 474 having user function values defined by function F and its inverse, respectively.

FIG. 4D illustrates an example table 475 in which the subsets associated with each column are not consistent, as required by step 315. For example, column 477 includes subsets 479 and 481. Subset 479 has user function values defined by function G and subset 481 has user function values defined by function F. Assuming function F is not the inverse of function G, column 477 is not consistent.

If step 315 determines that any of the subsets of user function values associated with bridged input values are inconsistent, or as defined by the examples of FIGS. 4C and 4D, that any column of the table includes subsets with values represented by two different functions, step 315 proceeds to step 325 and specifies that the selected function input assignment is unacceptable. Conversely, if all of the subsets of user function values associated with bridged input values are consistent, as described above, step 315 proceeds to step 320 and specifies that the selected input assignment is acceptable.

As discussed above, an embodiment of method 200 attempts to determine logic cell input port assignments and look-up table data only if the selected function input assignment is acceptable. To this end, an embodiment of step 225 of method 200 uses a SAT solver in a manner known to one of ordinary skill in the art to determine logic cell input port assignments and look-up table data for an incomplete function and an acceptable function input assignment. Because the previous steps of method 200 have already determined an acceptable function input assignment, the number of potential sets of logic cell input port assignments to be evaluated by the SAT solver is greatly reduced.

Figure 5:
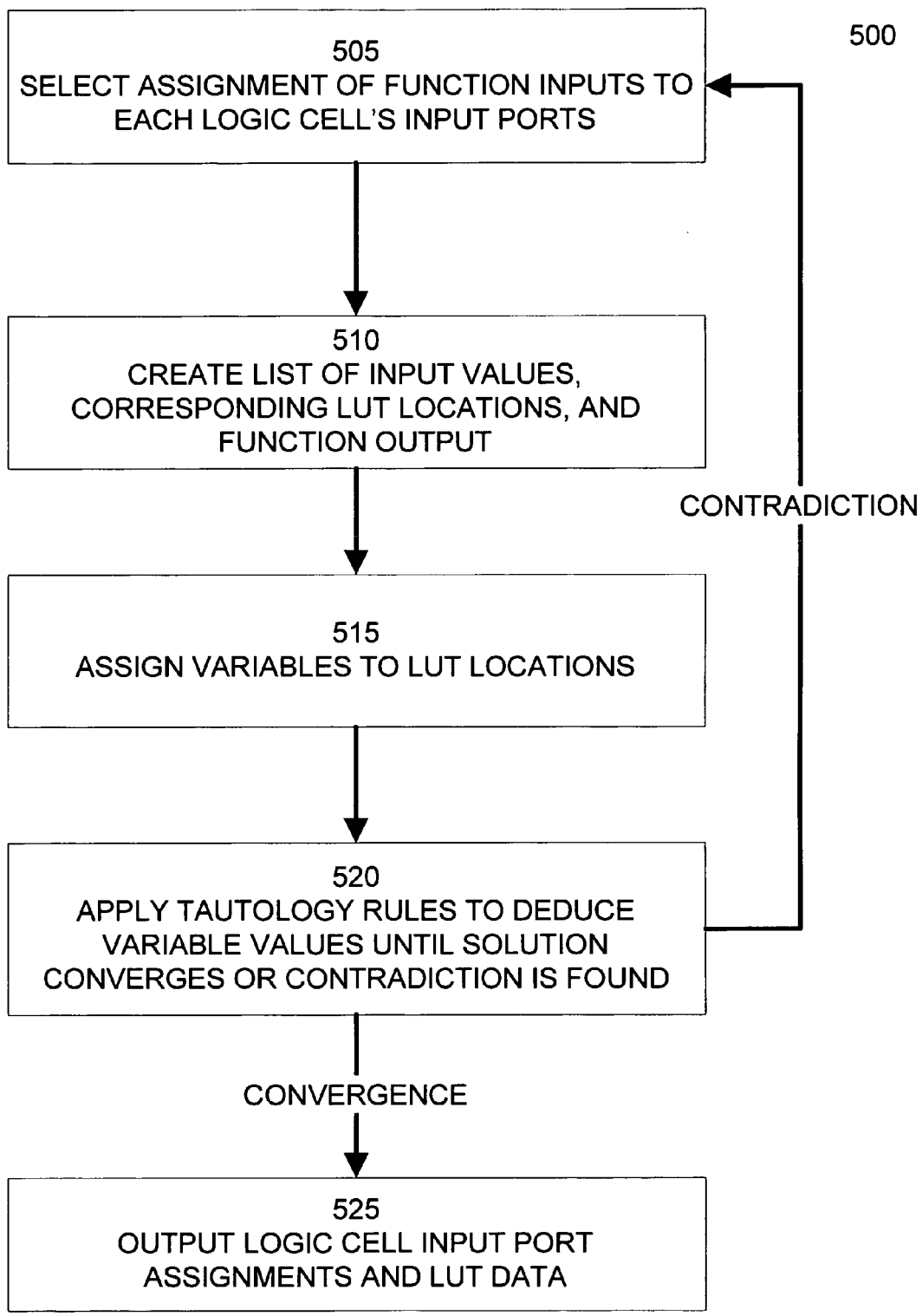
FIG. 5 illustrates a method of determining logic cell input port assignments and look-up table data that implement an incomplete function according to an embodiment of the invention.

In an alternate embodiment, FIG. 5 illustrates an alternate method 500 of determining logic cell input port assignments and look-up table data that implement an incomplete function. In an embodiment, method 500 can be utilized by step 225 of method 200 discussed above to determine logic cell input port assignments and look-up table data implementing an incomplete function for a given acceptable function input assignment.

Step 505 assigns the function inputs associated with each logic cell to logic cell input ports. Step 505 may be repeated many times during the execution of method 500, so an embodiment of step 505 is structured so as to not select any previously analyzed logic cell input port assignments. This can be done by assigning user function inputs to logic cell input ports in a specific order or by maintaining a list or other indicator of the previously analyzed logic cell input port assignments.

Step 510 creates a list or other data structure associating each set of user function input values with its corresponding function output value and, based on the logic cell input port assignments, one or more locations in the look-up tables of the logic cells used to determine the function output value. In cases where the output of a first look-up table is used to select a location from a second look-up table, the set of locations from the second look-up table will include alternate locations based on the possible values of the location in the first look-up table.

Figure 6:
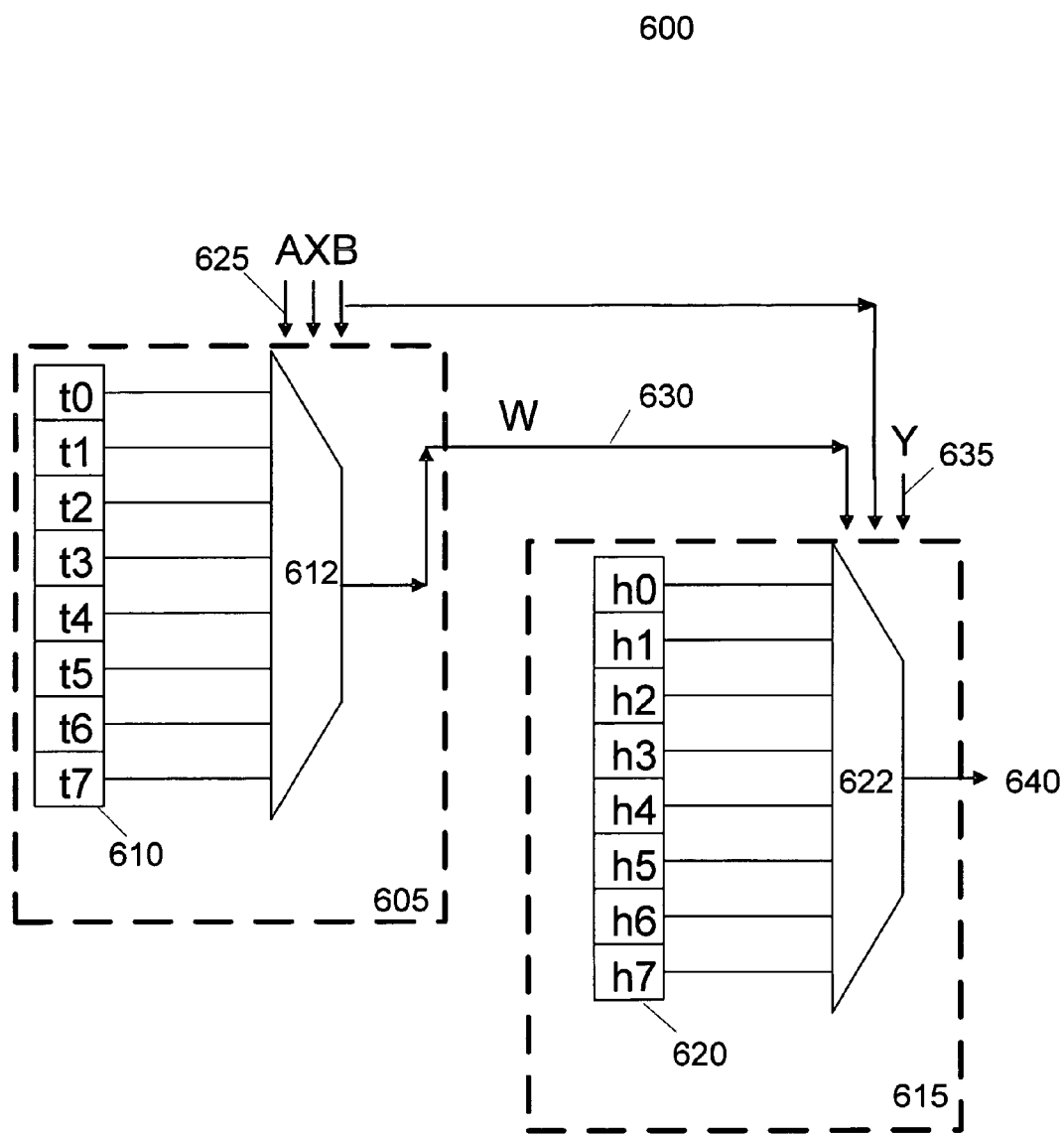
FIG. 6 is a simplified schematic of logic cells illustrating the application of a method of determining logic cell input port assignments and look-up table data according to an embodiment of the invention.

FIG. 6 is a simplified schematic 600 of logic cells illustrating the application of a method of determining logic cell input port assignments and look-up table data according to an embodiment of the invention. In this example simplified schematic 600, a head 615 and a tail 605 logic cells are connected to implement an example user function having four inputs: A, B, X, Y. The tail logic cell 605 includes three input lookup table 610. Look-up table 610 has eight locations for storing data, which are labeled t0 through t7. User function inputs A, X, and B assigned to the set of logic cell input ports 625 control multiplexer 612 in the order shown in FIG. 6, which selects data from one of the locations in the look-up table 610 for logic cell output 630. For example, if (A,X,B) equals (0,0,0), then location t0 is selected. Similarly, if (A,X,B) equals (1,0,1), then location t5 is selected. Although FIG. 6 illustrates the look-up table 610 being accessed by a multiplexer 612, in alternate embodiments, the look-up table of logic cells 605 and 615 can be implemented as any type of RAM or ROM memory array addressable using one or more address lines.

Similarly, head logic cell 615 includes look-up table 620 having data storage locations h0 through h7. The output 630 of the tail logic cell 605 and user function inputs B and Y are connected with the logic cell input ports 635 of the head logic cell 615, which in turn controls multiplexer 622. The values of user function inputs B and Y and the output 630 are used to select data from one of the locations of the look-up table 620 as the output 640 of the head logic cell 615. The value of output 640 represents the value of the function for a given set of user function input values.

Applying step 510 to the example user design 600, the step creates a list of user function input values, the corresponding locations in the look-up tables, and the output value of the function. For example, if the values of input (A,B,X,Y) are (0,0,0,0), the corresponding look-up table locations include location t0. Location t0 is selected by the values of user function inputs A, X, and B. The value of t0 is asserted on output 630. The value of location t0 and of user function inputs B and Y select a location from look-up table 620. As location t0 can be set to either a "1" or a "0," the output of the head logic cell 640 will either be h0, corresponding to input values (t0, B, Y) equal to (0, 0, 0), or h4, corresponding to input values (t0, B, Y) equal to (1, 0, 0).

Step 510 enumerates all possible user function input values and creates a list of the corresponding function output values and associated look-up table locations used by all of the logic cells for each set of user function input values. Given the logic cell configuration of FIG. 600 and an example four input user function F=(A&B)|X|Y, where & represents a Boolean AND operation and | represents a Boolean OR operation, Table 1 illustrates the example results of step 510.

TABLE 1

Example Input Values, Look-up Table Locations, and Function Output

| ABXY | Look-up Table Locations | Function Output |
|---|---|---|
| 0000 | T0, H0, H4 | 0 |
| 0001 | T0, H1, H5 | 1 |
| 0010 | T2, H0, H4 | 1 |
| 0011 | T2, H1, H5 | 1 |
| 0100 | T1, H2, H6 | 0 |
| 0101 | T1, H3, H7 | 1 |
| 0110 | T3, H2, H6 | 1 |
| 0111 | T3, H3, H7 | 1 |
| 1000 | T4, H0, H4 | 0 |
| 1001 | T4, H1, H5 | 1 |
| 1010 | T6, H0, H4 | 1 |
| 1011 | T6, H1, H5 | 1 |
| 1100 | T5, H2, H6 | 1 |
| 1101 | T5, H3, H7 | 1 |
| 1110 | T7, H2, H6 | 1 |
| 1111 | T7, H3, H7 | 1 |

Although Table 1 and the example of FIG. 6 illustrate the associated look-up table locations for a user function of four inputs, embodiments of step 510 can be similarly applied to more complicated logic cell configurations, such as that illustrated in FIGS. 1B and 1C.

Following step 510, step 515 assigns a variable to each look-up table location. In the example of FIG. 6, there are a total of sixteen variables, representing the sixteen look-up table locations. In the configuration of FIGS. 1B and 1C, there would be a total of 128 variables. Each variable represents the value of its respective look-up table location. The goal of method 500 is to determine a solution for this set of variables, if possible.

Figure 7A:
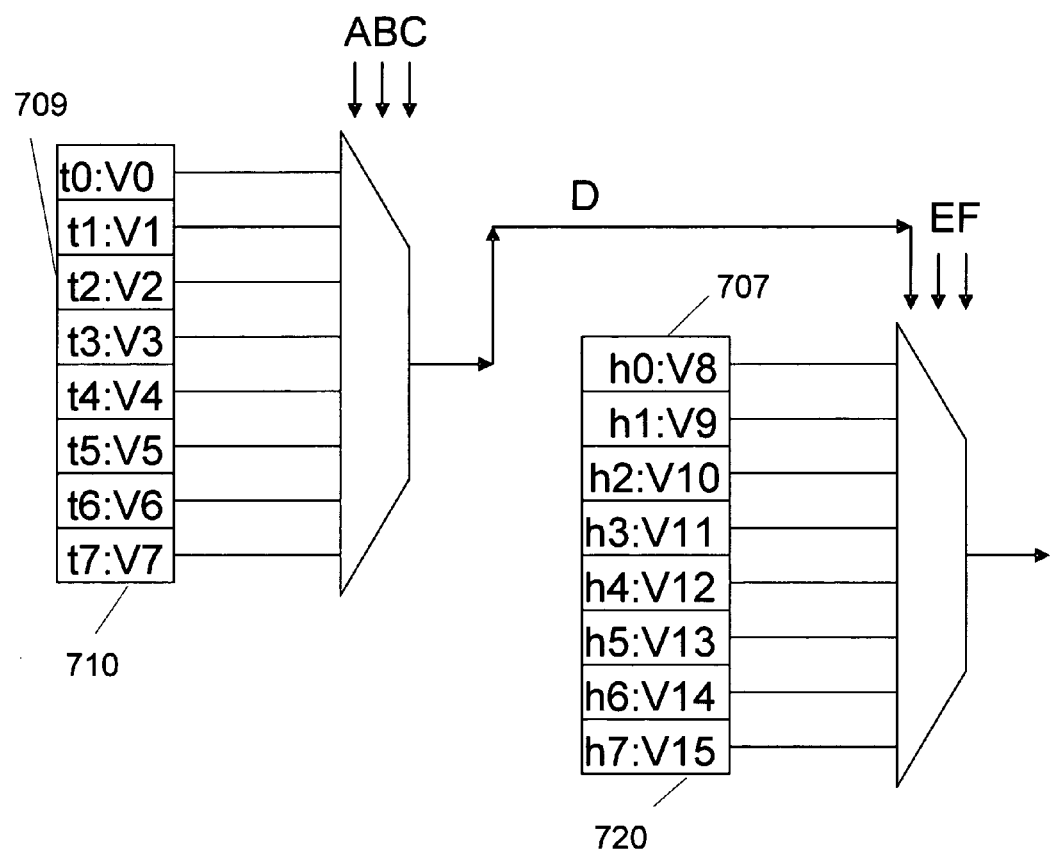
FIGS. 7A–7B illustrates the application of a method of determining logic cell input port assignments and look-up table data to an example incomplete function according to an embodiment of the invention.

FIG. 7A illustrates the application of step 515 to the logic cell configuration illustrated in FIG. 6. FIG. 7A illustrates an assignment 700 of the set of variables V0 through V15 to the locations of look-up tables 710 and 720. For example, location 707, representing location h0 in the look-up table 720, is assigned a variable V8. Similarly, location 709, representing location t2, is assigned a variable V2.

Step 520 applies a set of Boolean tautology rules to deduce the values of the variables. The Boolean tautology rules reflect the Boolean relationships between the values of look-up table locations based upon the configuration of the logic cells as well as the value of the function output. In an embodiment, these rules are applied in order to as many portions of the set of variable assignments as possible. Table 2 lists a set of Boolean tautology rules according to an embodiment of the invention. For alternative configurations of logic cells and their respective components, similar sets of Boolean tautology rules can be derived.

TABLE 2

Example Boolean Tautology Rules

Rule 1—If for all sets of look-up table locations where the same
two locations in the head logic cell look-up table, [h,h'] are
selected, the function output has the same value, assign that value
of the function output to h and h'.
When forming a conclusion re-express the problem in terms of the
simplest variables available. For example if h0 = variable_a and h1 = 1
and we conclude that h0 != h1 we replace variable_a with 0, rather than
assigning h1 to !variable_a.
Rule 2—If any head logic cell location, h, is not associated with any
function output, assign this look-up table location to 1 or 0 arbitrarily.
Rule 3—If there exists two sets of look-up table locations with the same
head look-up table locations and different tail look-up table locations
[t,h,h'] and [t',h,h')] (e.g. [t0,h0,h1] and [t1,h0,h1]) that have different
function output values, conclude h != h' ; t != t' ; and t != (h or h'),
according to the function value.
Rule 4—If head look-up table locations h and h' are both variable v,
then v = the value of the function for either location.
Rule 5—For a set of look-up table locations, if head look-up table location
h is not equal to the value of the function, then head look-up table loca-
tion
h' must be equal to the value of the function, and the value of the
associated location in the tail logic cell, t, must select location h'.
Additionally, if h' is not equal to the value of the function, then h
must be equal to the value of the function, and the value of the associated
location in the tail logic cell must select h.
Rule 6—If the value of a location in the tail logic cell look-up table is
known, then the location in the head logic cell look-up table selected by
this value is the value of the function output.
Rule 7—Observability don't care rules. These cover cases where the head
and tail signals are related in such a way that the tail value can be directly
concluded. For example:
if t=h' and the function for (t, h, h') equals 0 or if t is the opposite of h'
and the function for (t, h, h') = 1, then the value of look-up table
location t is 0
if t=h' and the function for (t, h, h') equals 1 or if t is the opposite of h'
and the function for (t, h, h') = 0, then the value of look-up table
location t is 1.
Rule 8—When no more conclusions can be made using rules 3 . . . 7 set
the remaining variables arbitrarily.

Figure 7B:
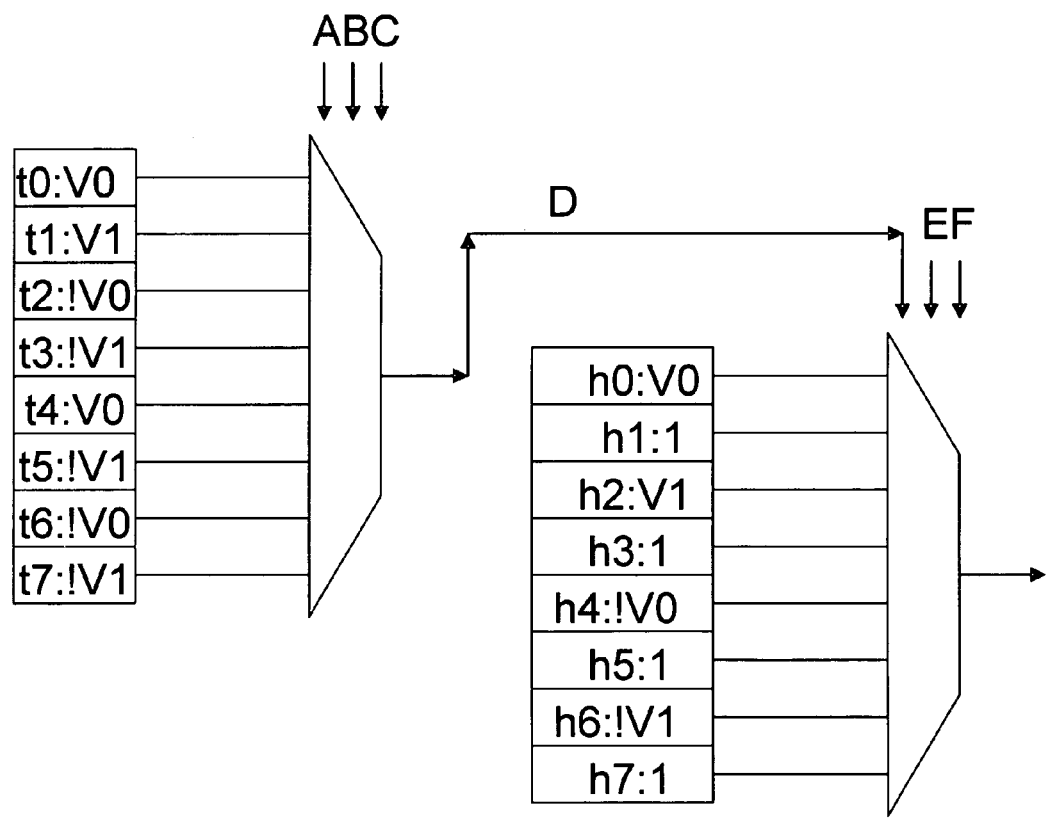

FIG. 7B illustrates the application of step 520 to the logic cell configuration illustrated in FIG. 6. FIG. 7B illustrates an assignment 750 of the set of variables following the application of the rules 1, 2, and 3 discussed above. As can be seen in assignment 750, the number of variables has dropped from sixteen to only two. Applying rules 4 through 7 to this example does not result in any further simplification. In an embodiment, rule 8 then selects arbitrary values for V0 and V1 and sets the values of their associated look-up table locations accordingly. In alternate embodiments, rule 8 can assign values to variables so as to produce a logic cell having a look-up table with desired qualities, like matching the configuration of an already existing look-up table in the user design to reduce area cost or increase speed, or to reduce the static leakage power loss by preferring configurations of look-up tables with more 0's than 1's, or vice-versa.

Step 520 applies the set of Boolean tautology rules until a solution for the values of all of the look-up table locations is found or until a contradiction is reached. A contradiction can occur if a single variable has to have two different values in order to satisfy the constraints imposed by the set of rules. Contradictions can be detected by analyzing the look-up table data for internal consistency with the constraints imposed by the function.

If a contradiction is reached, then method 500 proceeds from step 520 back to step 505 to select a different assignment of function inputs to the logic cell input ports. If step 505 has analyzed all of the possible assignments of function inputs to logic cell ports, then method 500 ends and, in an embodiment, a signal is output to indicate that the method was unsuccessful in finding a valid input port assignment and look-up table data for a given association of user function inputs with logic cells. If an embodiment of method 500 is used by step 225 of method 200, then as discussed above, method 200 returns to step 210 to try a different association of user function inputs with logic cells.

Conversely, if the set of variable assignments converge to a set of known values that are internally consistent, then step 525 outputs the current assignment of user function inputs to logic cell input ports and the look-up table data. In an embodiment, method 500 terminates following the identification of a single valid set of logic cell input port assignments and look-up table data.

In an alternate embodiment, method 500 is repeated until all possible logic cell input port assignments are analyzed so as to identify any additional valid sets of logic cell input port assignments and look-up table data. In further embodiments, two or more valid sets of logic cell input port assignments and corresponding look-up table data are analyzed with respect to one or more design goals, such as operating speed or power consumption. For example, if one of the function inputs is part of a timing critical path, one valid set of logic cell input port assignments might assign the function input so that the timing critical path passes through a single logic cell, while another valid set of logic cell input port assignments might assign the function input so that the timing critical path passes through two logic cells. In this example, the first set of logic cell input port assignments could be better for decreasing timing delay on the timing critical path and thus increasing operating speed.

Figure 8:
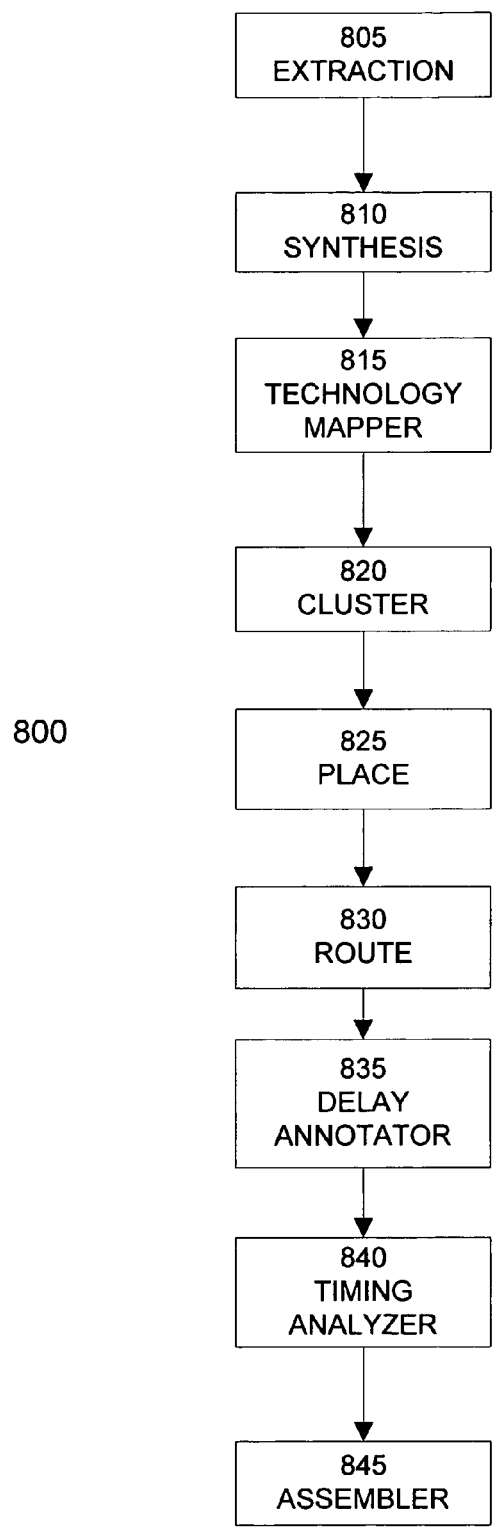
FIG. 8 illustrates a compilation process suitable for implementing an embodiment of the invention.

FIG. 8 illustrates a compilation process 800 suitable for implementing an embodiment of the invention. The compilation process 800 converts a user design into a programmable device configuration adapted to configure a programmable device to implement the user design. The extraction phase 805 converts a description of the user design, expressed for example in a hardware description language, into a register transfer layer description.

Synthesis phase 810 converts the register transfer layer description of the user design into a set of logic gates. Technology mapping phase 815 subdivides the set of logic gates into a set of atoms, which are groups of logic gates matching the capabilities of the logic cells or other functional blocks of the programmable device. A given user design may be converted into any number of different sets of atoms, depending upon the underlying hardware of the programmable device used to implement the user design.

Following the technology mapping phase 815, the cluster phase 820 groups related atoms together into clusters. The place phase 825 assigns clusters of atoms to locations on the programmable device. The route phase 830 determines the configuration of the configurable switching circuit of the programmable device used to connect the atoms implementing the user design.

The delay annotator phase 835 determines the signal delays for the set of atoms and their associated connections in the configurable switching circuit using a timing model of the programmable device. The timing analysis phase 840 determines the maximum operating speed of the programmable device when implementing the user design, for example by determining the portions of the user design have the largest signal delay.

The assembler phase 845 generates a set of configuration information specifying the configuration of the programmable device implementing the user design, including the configuration of each of the logic cells used to implement the user design and the configuration of the configurable switching circuit used to connect the logic cells. The assembler phase 845 can write the configuration information to a configuration file, which can then be used to configure one or more programmable devices to implement instances of the user design.

Figure 9:
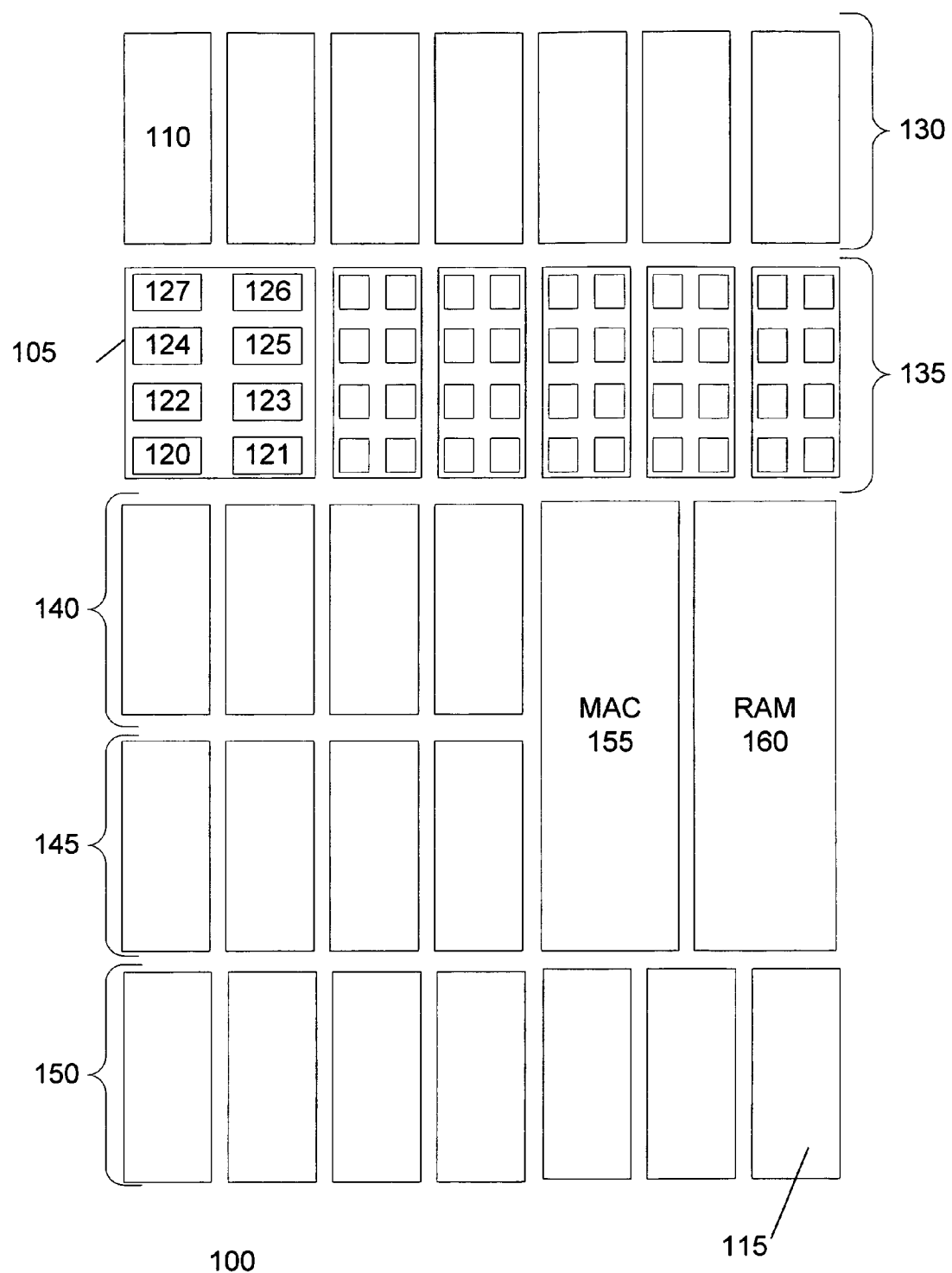
FIG. 9 illustrates a programmable device suitable for implementing a user design processed with an embodiment of the invention.

FIG. 9 illustrates a programmable device 900 suitable for implementing a user design processed with an embodiment of the invention. Programmable device 900 includes a number of logic array blocks (LABs), such as LABs 905, 910, 915. Each LAB includes a number of programmable logic cells using logic gates and/or look-up tables to perform a logic operation. LAB 905 illustrates in detail logic cells 920, 921, 922, 923, 924, 925, 926, and 927. Logic cells are omitted from other LABs in FIG. 9 for clarity. The LABs of device 900 are arranged into rows 930, 935, 940, 945, and 950. In an embodiment, the arrangement of logic cells within a LAB and of LABs within rows provides a hierarchical system of configurable connections, in which connections between logic cells within a LAB, between cells in different LABs in the same row, and between cell in LABs in different rows require progressively more resources and operate less efficiently.

In addition to logic cells arranged in LABs, programmable device 900 also include specialized functional blocks, such as multiply and accumulate block (MAC) 955 and random access memory block (RAM) 960. For clarity, the portion of the programmable device 900 shown in FIG. 9 only includes a small number of logic cells, LABs, and functional blocks. Typical programmable devices will include thousands or tens of thousands of these elements.

FIG. 10 illustrates a computer system 1000 suitable for implementing an embodiment of the invention. Computer system 1000 typically includes a monitor 1100, computer 1200, a keyboard 1300, a user input device 1400, and a network interface 1500. User input device 1400 includes a computer mouse, a trackball, a track pad, graphics tablet, touch screen, and/or other wired or wireless input devices that allow a user to create or select graphics, objects, icons, and/or text appearing on the monitor 1100. Embodiments of network interface 1500 typically provides wired or wireless communication with an electronic communications network, such as a local area network, a wide area network, for example the Internet, and/or virtual networks, for example a virtual private network (VPN).

Computer 1200 typically includes components such as one or more general purpose processors 1600, and memory storage devices, such as a random access memory (RAM) 1700, disk drives 1800, and system bus 1900 interconnecting the above components. RAM 1700 and disk drive 1800 are examples of tangible media for storage of data, audio/video files, computer programs, applet interpreters or compilers, virtual machines, and embodiments of the herein described invention. Further embodiments of computer 1200 can include specialized input, output, and communications subsystems for configuring, operating, testing, and communicating with programmable devices. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

Further embodiments can be envisioned to one of ordinary skill in the art after reading the attached documents. For example, although the invention has been discussed with reference to programmable devices, it is equally applicable to logic minimization applications used to design any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A method of determining a configuration implementing a function for a set of at least two logic cells, the method comprising:
   (a) specifying an arrangement of a first and second logic cells, wherein the arrangement includes an output of the second logic cell connected with one of a first set of logic cell input ports of the first logic cell;
   (b) receiving a function including function inputs;
   (c) creating a partitioning of the function inputs into a first portion associated with a first logic cell and a second portion associated with a second logic cell;
   (d) screening the partitioning of the function inputs to determine if the partitioning is potentially acceptable;
   (e) in response to a determination that the partitioning of the function inputs is potentially acceptable:
     (1) creating an assignment of at least the first portion of function inputs to the first set of logic cell input ports;
     (2) creating an assignment of the second portion of function inputs to a second set of logic cell input ports of the second logic cell;
     (3) assigning variables to look-up table locations of the first and second logic cells;
     (4) determining a correspondence between function input values, function output values, the variables, and the look-up table locations based on the arrangement of the first and second logic cells and the assignments of the portions of the function inputs to the first and second sets of logic cell input ports;
     (5) applying Boolean tautology rules to the correspondence to create a simplified set of variables;
     (6) evaluating the simplified set of variables for consistency; and
     (7) in response to a determination that the simplified set of variables is consistent, outputting the configuration implementing the received function, wherein the configuration includes assignments of the portions of the function inputs to the first and second sets of logic cell input ports and look-up table data based on values of the simplified set of variables.

2. The method of claim 1, comprising:
   in response to a determination that the partitioning of the function inputs is not potentially acceptable, repeating (c), (d), and (e) for at least one alternate partitioning of the function inputs into a first portion associated with a first logic cell and a second portion associated with a second logic cell.

3. The method of claim 1, comprising:
   in response to a determination that the simplified set of variables is not consistent, repeating (1), (2), (3), (4), (5), (6), and (7) for at least one alternate assignment of at least the first portion of function inputs to the first set of logic cell input ports and at least one alternate assignment of the second portion of function inputs to the second set of logic cell input ports of the second logic cell.

4. The method of claim 1, wherein the Boolean tautology rules are based on the relationship between the first set of logic cell input ports, a selection of at least one look-up table location in the first logic cell, and an output of the first logic cell.

5. The method of claim 1, wherein the first and second portions of the function inputs include at least one common function input.

6. The method of claim 5, wherein the function inputs include eleven function inputs and the first and second portions of the function inputs include two common function inputs.

7. The method of claim 1, wherein screening the partitioning of the function inputs comprises:
determining if a portion of the function defined by the first portion of the function inputs can be implemented using a complete look-up table.

8. The method of claim 1, wherein screening the partitioning of the function inputs comprises:
enumerating function input values for a subset of the first portion of the function inputs associated only with the first logic cell;
generating cofactors representing function output values corresponding with the function input values;
enumerating second function input values for a subset of the first portion of the function inputs associated with the first and second logic cells;
extracting the second function input values from the cofactors, thereby forming a subset of cofactors for each of the second function input values;
evaluating each of the subsets of cofactors for consistency; and
specifying that the partitioning of the function inputs is potentially acceptable if each of the subsets of cofactors is consistent.

9. The method of claim 1, wherein the function is received from a compilation program adapted to convert a specification of a user design into a configuration of a programmable device.

10. The method of claim 1, wherein applying the Boolean tautology rules to the correspondence to create a simplified set of variables includes assigning an arbitrary value to at least one of the variables.

11. The method of claim 9, wherein the arbitrary value is specified in accordance with a desired logic cell attribute.

12. A method of determining a configuration implementing a function for hardware including at least one logic cell, the method comprising:
(a) receiving a function including function inputs;
(b) creating an assignment of at least a portion of the function inputs to logic cell input ports of a logic cell;
(c) creating an assignment of variables to look-up table locations of the logic cell;
(d) determining a correspondence between function input values, function output values, the assignment of variables, and the look-up table locations based on an internal structure of the logic cell and the assignment of function inputs to logic cell input ports;
(e) applying a set of Boolean tautology rules to the correspondence to create a simplified set of variables;
(f) evaluating the simplified set of variables for consistency; and (g) in response to a determination that the simplified set of variables is consistent, outputting the configuration implementing the received function, wherein the configuration includes the assignment of the function inputs to the logic cell input ports and look-up table data based on values of the simplified set of variables.

13. The method of claim 12, comprising:
in response to a determination that the simplified set of variables is not consistent, repeating (b), (c), (d), (e), (f), and (g) for at least one alternate assignment of at least the portion of the function inputs to the logic cell input ports of the logic cell.

14. The method of claim 12, wherein the Boolean tautology rules are based on the relationship between the logic cell input ports, a selection of at least one look-up table location in the logic cell, and an output of the logic cell.

15. The method of claim 12, wherein the function is received from a compilation program adapted to convert a specification of a user design into a configuration of a programmable device.

16. The method of claim 12, wherein applying the Boolean tautology rules to the correspondence to create a simplified set of variables includes assigning an arbitrary value to at least one of the variables.

17. The method of claim 16, wherein the arbitrary value is specified in accordance with a desired logic cell attribute.

18. An information storage medium comprising a plurality of instructions adapted to direct an information processing device to perform an operation comprising:
(a) specifying an arrangement of a first and second logic cells, wherein the arrangement includes an output of the second logic cell connected with one of a first set of logic cell input ports of the first logic cell;
(b) receiving a function including function inputs;
(c) creating a partitioning of the function inputs into a first portion associated with a first logic cell and a second portion associated with a second logic cell;
(d) screening the partitioning of the function inputs to determine if the partitioning is potentially acceptable;
(e) in response to a determination that the partitioning of the function inputs is potentially acceptable:
(1) creating an assignment of at least the first portion of function inputs to the first set of logic cell input ports;
(2) creating an assignment of the second portion of function inputs to a second set of logic cell input ports of the second logic cell;
(3) assigning variables to look-up table locations of the first and second logic cells;
(4) determining a correspondence between function input values, function output values, the variables, and the look-up table locations based on the arrangement of the first and second logic cells and the assignments of the portions of the function inputs to the first and second sets of logic cell input ports;
(5) applying Boolean tautology rules to the correspondence to create a simplified set of variables;
(6) evaluating the simplified set of variables for consistency; and
(7) in response to a determination that the simplified set of variables is consistent, outputting the configuration implementing the received function, wherein the configuration includes assignments of the portions of the function inputs to the first and second sets of logic cell input ports and look-up table data based on values of the simplified set of variables.

19. The information storage medium of claim 18, comprising:
in response to a determination that the partitioning of the function inputs is not potentially acceptable, repeating (c), (d), and (e) for at least one alternate partitioning of the function inputs into a first portion associated with a first logic cell and a second portion associated with a second logic cell.

20. The information storage medium of claim 18, comprising:
in response to a determination that the simplified set of variables is not consistent, repeating (1), (2), (3), (4), (5), (6), and (7) for at least one alternate assignment of at least the first portion of function inputs to the first set of logic cell input ports and at least one alternate assignment of the second portion of function inputs to the second set of logic cell input ports of the second logic cell.

21. The information storage medium of claim 18, wherein the Boolean tautology rules are based on the relationship between the first set of logic cell input ports, a selection of at least one look-up table location in the first logic cell, and an output of the first logic cell.

22. The information storage medium of claim 18, wherein the first and second portions of the function inputs include at least one common function input.

23. The information storage medium of claim 22, wherein the function inputs include eleven function inputs and the first and second portions of the function inputs include two common function inputs.

24. The information storage medium of claim 18, wherein screening the partitioning of the function inputs comprises:
determining if the first portion of the function inputs can be implemented using a complete look-up table.

25. The information storage medium of claim 18, wherein screening the partitioning of the function inputs comprises:
enumerating function input values for a subset of the first portion of the function inputs associated only with the first logic cell;
generating cofactors representing function output values corresponding with the function input values;
enumerating second function input values for a subset of the first portion of the function inputs associated with the first and second logic cells;
extracting the second function input values from the cofactors, thereby forming a subset of cofactors for each of the second function input values;
evaluating each of the subsets of cofactors for consistency; and
specifying that the partitioning of the function inputs is potentially acceptable if each of the subsets of cofactors is consistent.

26. The information storage medium of claim 18, wherein the function is received from a compilation program adapted to convert a specification of a user design into a configuration of a programmable device.

27. The information storage medium of claim 18, wherein applying the Boolean tautology rules to the correspondence to create a simplified set of variables includes assigning an arbitrary value to at least one of the variables.

28. The information storage medium of claim 26, wherein the arbitrary value is specified in accordance with a desired logic cell attribute.

* * * * *